United States Patent
Koo et al.

(10) Patent No.: US 7,655,512 B2
(45) Date of Patent: Feb. 2, 2010

(54) METHOD FOR FORMING ELECTRODES OF ORGANIC ELECTRONIC DEVICES, ORGANIC THIN FILM TRANSISTORS COMPRISING SUCH ELECTRODES, AND DISPLAY DEVICES COMPRISING SUCH TRANSISTORS

(75) Inventors: Bon Won Koo, Suwon-si (KR); Sang Yoon Lee, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 567 days.

(21) Appl. No.: 11/649,806

(22) Filed: Jan. 5, 2007

(65) Prior Publication Data
US 2007/0267628 A1    Nov. 22, 2007

(30) Foreign Application Priority Data
May 16, 2006    (KR) ............... 10-2006-0043759

(51) Int. Cl.
*H01L 21/84* (2006.01)
(52) U.S. Cl. ............ 438/158; 438/99; 438/151; 257/40; 257/59; 257/66; 257/72; 257/E51.029

(58) Field of Classification Search ............ 257/40, 257/59, 66, 72, E39.007, E51.027, E51.028, 257/E51.029, E51.031; 438/99, 151, 158
See application file for complete search history.

(56) References Cited

U.S. PATENT DOCUMENTS

| 2005/0001210 | A1 | 1/2005 | Lee et al. |
| 2005/0127355 | A1 | 6/2005 | Jeong et al. |
| 2005/0259212 | A1 | 11/2005 | Lee et al. |
| 2006/0147715 | A1 | 7/2006 | Lee et al. |

*Primary Examiner*—Matthew C Landau
*Assistant Examiner*—Colleen E Snow
(74) *Attorney, Agent, or Firm*—Harness, Dickey & Pierce, P.L.C.

(57) ABSTRACT

Disclosed are methods for forming electrodes for organic electronic devices which allow for the use of an improved range of conductive materials for forming source/drain electrodes. The disclosed methods also allow for the use of different conductive materials for forming data lines and source/drain electrodes during the fabrication of organic electronic devices. Organic electronic devices manufactured according to the methods may provide advantages over conventional methods including, for example, improved patterning and increased accuracy in the formation of electrodes for organic electronic devices. Organic electronic devices fabricated according to the disclosed method are expected to be useful in display devices and electronic displays.

20 Claims, 7 Drawing Sheets

METHOD FOR FORMING ELECTRODES OF ORGANIC ELECTRONIC DEVICES, ORGANIC THIN FILM TRANSISTORS COMPRISING SUCH ELECTRODES, AND DISPLAY DEVICES COMPRISING SUCH TRANSISTORS

PRIORITY STATEMENT

This non-provisional application claims priority under 35 U.S.C. §119(a) on Korean Patent Application No. 2006-43759, which was filed in the Korean Patent Office on May 16, 2006, the content of which is herein incorporated, in its entirety, by reference.

BACKGROUND

1. Field of Endeavor

Example embodiments include methods for forming electrodes for organic electronic devices, organic thin film transistors comprising electrodes formed by such methods, and display devices comprising such organic thin film transistors. More specifically, example embodiments include methods for forming electrodes for organic electronic devices in which the source/drain electrodes and data lines can be formed using different conductive materials, organic thin film transistors comprising such electrodes, and display devices comprising such organic thin film transistors.

2. Description of the Related Art

Efforts to increase levels of integration in electronic devices including, for example, integrated circuits and liquid crystal displays, and reduce the overall size of the electronic devices have resulted in design rules reflecting gradually decreasing critical dimensions including, for example, the conductor width and spacing of electrode patterns formed during fabrication of such devices.

Shadow mask, photolithography and ink-jet printing processes are currently used for forming micropatterns of electrodes on substrates. As illustrated in FIG. 1, the formation of electrodes using a conventional ink-jet printing process typically includes forming a gate electrode on a substrate. A gate insulator pattern is then formed on the gate electrode and source/drain electrodes (for example, Au electrodes) are formed on the gate insulator pattern. Active region banks are then formed on the source/drain electrodes and the gate insulator pattern, and finally, an active region pattern is then formed on the gate insulator pattern in the region defined by the active region banks.

Problems associated with the conventional shadow-mask processes include, for example, a limited selection of electrode materials including, for example, such as gold (Au) and indium tin oxide (ITO), and limited patterning of electrodes. Further, the use of photographic processes causes the problem that materials for source/drain electrodes, i.e., materials for data lines, are generally limited to gold (Au) and indium tin oxide (ITO). Further, ink-jet printing processes may have difficulty forming electrode patterns consistently exhibiting the desired sizing and registration for fabricating devices governed by design rules that, for example, limit electrode width to not more than 40 µm, intended to provide an increased degree of integration.

As illustrated in FIGS. 1A-1E, conventional fabrication of transistor may include the formation of the gate electrode on a suitable substrate 100 after the substrate has been prepared and/or cleaned to prepare the surface and remove impurities using one or more conventional processes. As will be appreciated by those in the art, a wide range of substrate materials may be used successfully including organic and inorganic insulating materials. A conductive layer may then formed on the cleaned substrate and patterned to obtain a gate electrode pattern 102. Conventional metals, metal alloys, metal nitrides, metal oxides, silicides and/or one or more conductive polymers can be used in forming the conductive layers from which the gate electrode pattern is formed.

A gate insulator pattern 104 may then be formed on the gate electrode pattern 102 using a conventional process. As will be appreciated by those skilled in the art, there are a number of conventional materials that may be suitable for forming the gate insulator pattern including, for example, organic materials and/or inorganic materials.

Source/drain electrodes 106 may then be formed on the gate insulator pattern 104. Active region banks 108 may then be formed to define an active region between the source/drain electrodes 106 and above a region of the gate insulator pattern 104 and the gate electrode pattern 102. A semiconductor material 110 is then deposited between the active region banks to form an active region that is controlled by the gate electrode 102 to provide for current flow between the corresponding source/drain electrodes 106. The fabrication of the semiconductor device may then be completed using a range of conventional processes that will be well known to one of ordinary skill in the art.

SUMMARY OF THE DISCLOSURE

Example embodiments include methods for forming electrodes for organic electronic devices using a wider variety of materials including, for example, example embodiments in which different materials are used for forming data lines and source/drain electrodes. Example embodiments also include organic thin film transistors incorporating electrodes formed using such methods, display devices incorporation such organic thin film transistors and electronic display systems incorporating such display devices.

More particularly, example embodiments include methods for forming electrodes for organic electronic devices by forming a gate electrode on a substrate; forming a gate insulator pattern on the gate electrode and the substrate; forming data lines on the gate insulator pattern; forming an active region pattern between the data lines on the gate insulator pattern; and forming source/drain electrodes on the data lines and the gate insulator pattern, wherein the source/drain electrodes are separated from each other by a barrier channel structure and further wherein the source/drain electrodes are fabricated from a material or materials different from the composition of the data lines.

BRIEF DESCRIPTION OF THE DRAWINGS

Example embodiments described below will be more clearly understood when the detailed description is considered in conjunction with the accompanying drawings, in which.

Figure 1A:
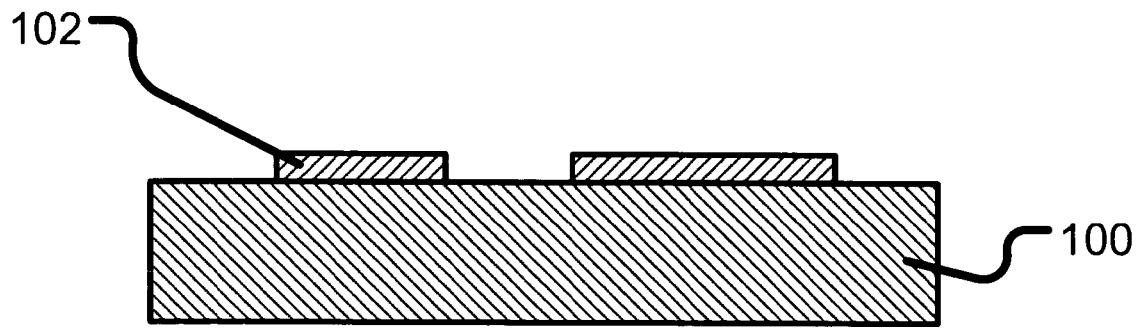
FIGS. 1A-1E are cross-sectional representations of a conventional method for forming electrodes using a printing process.
Figure 1B:
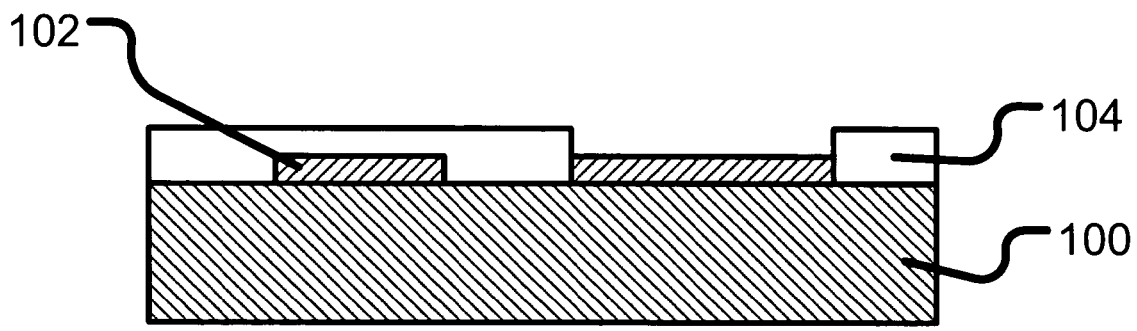
Figure 1C:
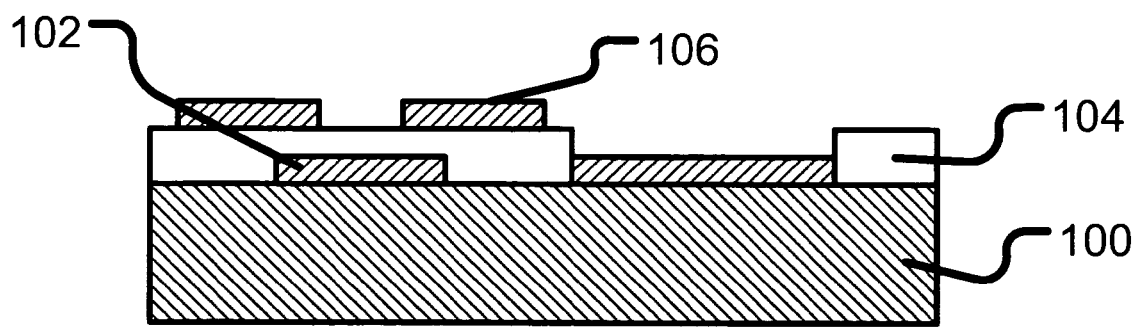
Figure 1D:
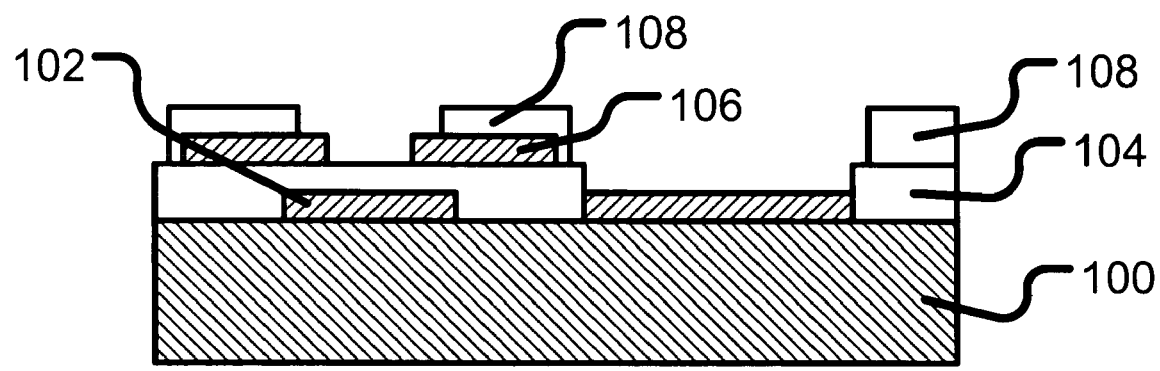
Figure 1E:
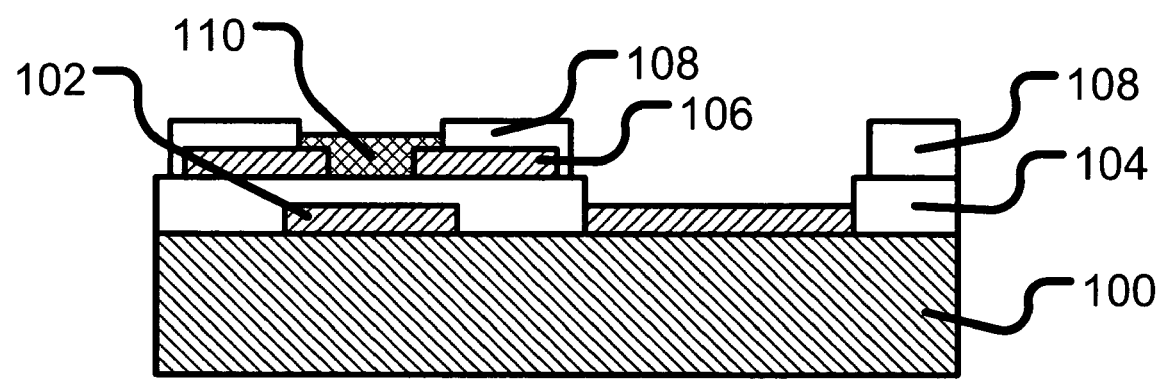

It should be noted that these Figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. In particular, the relative thicknesses and positioning layers, regions and/or structural elements may be reduced or exaggerated for clarity. The use of similar or identical reference numbers in the various drawings is intended to indicate the presence of a similar or identical element or feature.

DESCRIPTION OF EXAMPLE EMBODIMENTS

Example embodiments will now be described in greater detail with reference to the accompanying drawings.

As illustrated in FIGS. 2A-G, the formation of the gate electrode may include washing a suitable substrate 200 to remove impurities present thereon using a conventional cleaning process. As will be appreciated by those in the art, a wide range of substrate materials may be used successfully including organic and inorganic insulating materials, for example, glasses, plastics and oxides, and/or semiconducting materials, for example, silicon, germanium and/or III-V compounds and combinations thereof, for example, SOI substrates. A conductive layer is then formed on the cleaned substrate, patterned and etched to obtain a gate electrode pattern 202. Conventional metals, metal alloys, metal nitrides, metal oxides, silicides and/or one or more conductive polymers can be used in forming the conductive layers from which the gate electrode pattern is formed. Such gate electrode materials include, for example, gold (Au), silver (Ag), aluminum (Al), nickel (Ni), molybdenum (Mo), tungsten (W), indium-tin oxide (ITO), polythiophene, polyaniline, polyacetylene, polypyrrole, polyphenylene vinylene and/or polyethylenedioxythiophene (PEDOT)/polystyrenesulfonate (PSS) mixtures.

A gate insulator pattern 204 may then be formed on the gate electrode pattern 202 using a conventional process. As will be appreciated by those skilled in the art, there are a number of conventional materials that may be suitable for forming the gate insulator pattern including, for example, organic materials, such as polyolefin, polyvinyl, polyacrylate, polystyrene, polyurethane, polyimide, polyvinylphenol and derivatives thereof, and/or inorganic materials, such as $SiN_x$ ($0<x<4$), $SiO_2$, $Al_2O_3$ and combinations thereof As will be appreciated by those skilled in the art, the suitability of a particular composition and thickness of the gate insulator pattern 204 may be evaluated in light of factors including, for example, the subsequent processing to which the material(s) will be exposed, the dielectric constant of the material(s) and the uniformity of the resulting film.

Organic materials suitable for forming the gate insulator pattern are expected to include, for example, polymeric materials containing one or more crosslinking agents and organic-inorganic hybrid insulating materials. Examples of such materials are disclosed in, for example, U.S. Pat. Appl. Pub. Nos. 2006/0147715, 2005/0259212 and 2005/0127355, (which correspond to Korean Patent Application Nos. 10-2003-90309 and 10-2003-71775), and U.S. Published Patent Application Nos. 2005/0001210, the disclosures of which are hereby incorporated, in their entirety, by reference. Similarly, it is anticipated that such organic materials 204 may be coated on the gate electrode 202 to a thickness on the order of 3,000 Å and 7,000 Å to form the gate insulating layer.

The range of processes that may be utilized in forming the gate insulator pattern is not especially limited. Conventional processes that may be utilized include, for example, include both vacuum evaporation and solution deposition using, for example, spin casting, spin coating, spray coating, electrostatic coating, dip coating, blade coating, roll coating, and ink-jet printing. In the case of solution deposition, if needed, a soft bake may be performed at a soft bake temperature of about 60° C. to about 150° C. for a period of about 1 minute to about 10 minutes, and/or a hard bake may be performed at a hard bake temperature of about 100° C. to about 200° C. for a period of about 30 minutes to about 3 hours to obtain a substantially solid layer suitable for additional processing.

Data lines 206 may then be formed on the gate insulator pattern 204 to provide conductive paths for transmitting data signals to and from the resulting device. Data lines 206 may be configured as pairs of elongated conductors associated with a number of organic thin film transistors ("OTFT") that comprise a portion of an array. Each of the data lines 206 may also include a plurality of projecting regions which may extend, for example, from source electrodes toward corresponding drain electrodes. Further, each of the electrodes included in a corresponding pair of the source and drain electrodes will typically be isolated from each other.

The data lines will typically be formed from one or more metals and/or one or more metal compounds that are sized to provide sufficient conductivity to reduce propagation delay of data signals and/or reduce voltage drops during device operation. The metal(s) may be selected from a group including, for example, gold (Au), silver (Ag), aluminum (Al), nickel (Ni), molybdenum (Mo), tungsten (W), and alloys and combinations thereof. The metal compounds may be selected from a group including, for example, metal oxides and metal nitrides such as indium tin oxide (ITO), indium zinc oxide (IZO), tungsten nitride (WN) and combinations thereof, which may be included with one or more metals in a multilayer composite conductive structure. Processes that may be used for forming the data lines on the gate insulator pattern include, for example, conventional chemical vapor deposition (CVD) processes, such as low pressure chemical vapor deposition (LPCVD) and plasma enhanced chemical vapor deposition (PECVD), sputtering processes and/or evaporation processes.

An active region pattern 210 may then be formed on a portion of the gate insulator pattern 204 between corresponding pairs of data lines 206. The active region pattern 210 may be defined using active region banks 208 to form a perimeter around an area of the gate insulator pattern 204 on which the active region pattern will be formed. As used herein, the term "banks" connotes partitioning structures of sufficient dimensions to confine flowable materials, for example, ink and polymeric materials, to one or more specific regions, for example, an array of individual pixel regions, and thereby improve the patterning precision and to suppress cross-contamination between adjacent regions. Accordingly, the use of these banks will also tend to reduce cross-talk between adjacent devices and to define regions so that an ink or other flowable media is remains only within desired zones.

The active region banks may be formed using conventional patterning methods known to those skilled in the art. According to example embodiments, the formation of the active region banks may be achieved by a method comprising applying a film of a water-soluble polymer solution containing a UV curing agent and a water-soluble fluorine compound, and irradiating portions of the water-soluble polymer film with UV light of sufficient wavelength, intensity and duration to form an exposed film using conventional photolithographic processes and techniques. This exposed film will include regions that remain water soluble and regions that have become substantially insoluble in water as a result of the exposure process. This exposed film may then be developed using conventional developing processes to obtain the desired pattern of residual polymeric material.

The water-soluble polymer used in forming the water-soluble film includes one or more functional groups that exhibit an increased affinity for water, for example, —OH, —COOH, —NH$_2$ and/or —CONH$_2$ groups, within the molecular structure that allows the polymer to be readily dissolved in water due to the absence or relatively low levels of crosslinking between the individual polymer molecules. Using water-soluble polymers addresses and reduces the problem of degraded performance of organic electronic devices that has been associated with deterioration in the pixel regions of adjacent organic electronic devices resulting from the conventional process of using a photoresist and an organic solvent to form the bank structures. By using water-soluble polymers and an aqueous developing solution, methods according to example embodiments enable the formation of banks while reducing or eliminating the adverse effects on the pixel regions of adjacent organic electronic devices.

The water-soluble polymers are not particularly limited and may be selected from a group consisting of polyvinyl alcohols, polyvinyl chlorides, polyacryl amides, polyethylene glycols, polyethylene oxides, polymethyl vinyl ethers, polyethylene imines, polyphenylene vinylenes, polyanilines, polypyrroles, copolymers and higher order polymers including less water-soluble polymers, and mixtures and combinations thereof. If combined with less water-soluble polymers in a copolymer, terpolymer or higher order polymer, the resulting polymeric compound will typically contain from 10 to 99% by weight of the water-soluble polymer(s) in order to maintain sufficient solubility.

The UV curing agent(s) facilitate curing of the banks during UV irradiation. Examples of such UV curing agents include, for example, ammonium dichromate, pentaerythritol triacrylate, urethane acrylate, and mixtures thereof. The UV curing agent is typically added to an aqueous solution of the water-soluble polymer(s) prepared, for example, using deionized water. The ratio of the UV curing agent to the water-soluble polymer may be in the range of 1:100 to 1:20 and more typically, will be in the range of 1:50 to 1:25 based on the "dry" or solids content of the solution.

The water-soluble film may be formed using a number of conventional coating techniques and methods including, for example, spin coating, dip coating, printing, ink-jet printing and roll coating. The process of forming the banks may also include intermediate treatments to the water-soluble film including, for example, drying the film to remove a majority of the solvent, water, before proceeding to the exposure processes. Drying the water-soluble film may be achieved using a variety of conventional processes well known to those of ordinary skill in the art and may include, for example, a combination of bakes at different temperatures, such as a "soft" bake followed by a higher temperature "hard" bake, to improve the stability of the water-soluble polymer film. Alternatively, a single bake of, for example, at 50 to 150° C. for a bake period of 0.5 to 2 hours may be achieved by placing the coated substrate on a hot plate maintained at a suitable temperature.

The UV irradiation may be performed using a lamp configured to provide an exposure intensity and duration sufficient to induce cross-linking of the polymers throughout the full thickness of the water-soluble polymer film, thus rendering the exposed regions generally insoluble in water. A lamp or other exposure system configured to provide, for example, an exposure intensity of 300 to 500 W/cm$^2$ with light characterized by a wavelength of 340 to 400 nm, typically for an exposure time of 10 to 180 seconds would be expected to provide suitable performance.

The selection of the polymer(s), the thickness and uniformity of the water-soluble film and the pre-exposure processing, for example, one or more bakes, should be sufficient to allow the exposed film to be developed, i.e., removing substantially all the unexposed water-soluble film, by a development process including applying deionized water at room temperature (approximately 25° C.) to the exposed film for a development period of from 1 to 5 minutes. It is anticipated that the banks utilized in methods according to example embodiments may be fabricated using the sequence of coating, UV irradiation and development using deionized water under the conditions described above.

A mixture of the water-soluble polymer containing the UV curing agent and a water-soluble fluorine compound is used to achieve the simultaneous formation and surface treatment of banks, thus avoiding the need for additional processing, for example, surface treatments associated with conventionally formed banks for modifying the contact angle performance of previously formed banks, and simplifying the processing.

The water-soluble fluorine compound(s) serve to provide a difference in the hydrophilicity of banks relative to that of the adjacent channel regions and thereby provide an increased contact angle. The amount of the water-soluble fluorine compound necessary to achieve the desired difference in the hydrophilicity will be a function of, for example, both the particular fluorine compound(s) utilized and the characteristics of the water-soluble polymer(s) incorporated into the solution. It is anticipated that ratio of the water-soluble fluorine compound(s) to the water-soluble polymer(s) and the UV curing agent in the range of 1:10 to 1:1, based on the solids content will provide satisfactory performance.

The water-soluble fluorine compound(s) may be selected from a group consisting of fluoroalkanes and their derivatives, perfluoroalkylalcohol ethylene oxides and their derivatives, perfluoroalkylcarboxylic acids and their salts, perfluoroalkylsulfonic acids and their salts, perfluoroalkyloxybenzenesulfonic acids and their salts, perfluoroalkylbenzenesulfonic acids and their salts, perfluoroalkyl amine and their salts, perfluoroalkylsulfonamides and their salts, ammonium fluoride, monoethanolamine fluoride, tetramethylammonium fluoride and combinations and mixtures thereof.

After the active region banks 208 have been formed, an active region pattern 210 may be formed between the banks using a conventional printing process, for example, ink-jet printing, exhibiting sufficient precision and accuracy to apply the active region material within the region bounded by the banks. The semiconductor material used in forming the active region pattern is not particularly limited, but will typically be compositions that are sufficiently flowable to form an "ink" suitable for use in conventional printing assemblies that may be used for applying the material to form the active region pattern. Examples of such semiconductor materials include, for example, pentacene, tetracene, copper phthalocyanine, polythiophene, polyaniline, polyacetylene, polypyrrole, polyphenylene vinylene, and derivatives, combinations and mixtures thereof.

Figure 2A:
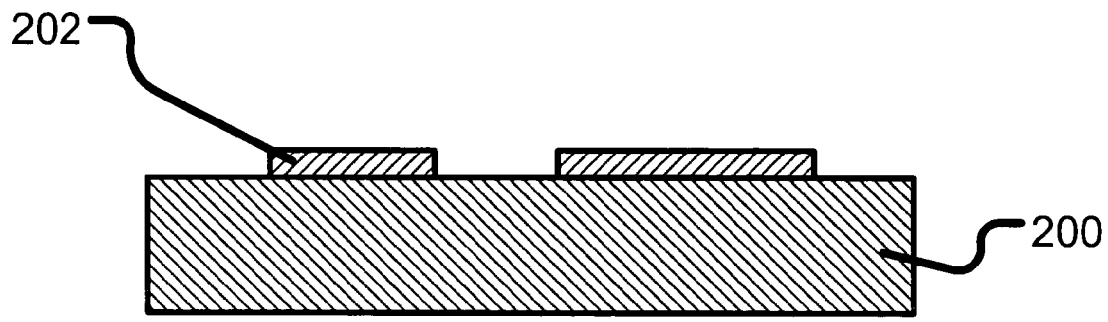
FIGS. 2A-2G are cross-sectional representations of a method for forming electrodes of an organic electronic device according to an example embodiment.
Figure 2B:
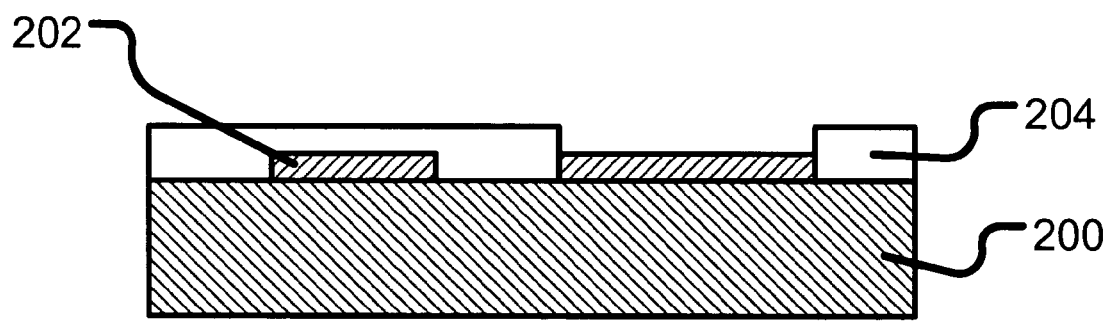
Figure 2C:
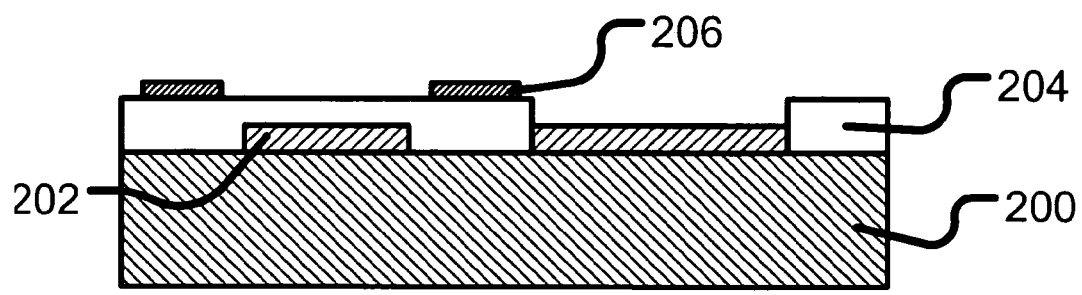
Figure 2D:
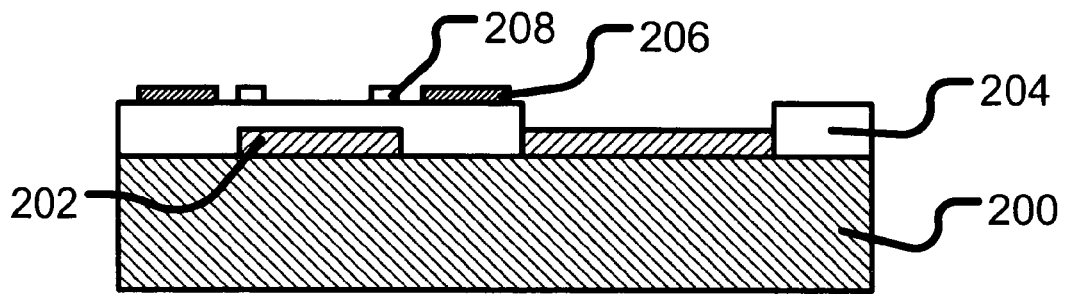
Figure 2E:
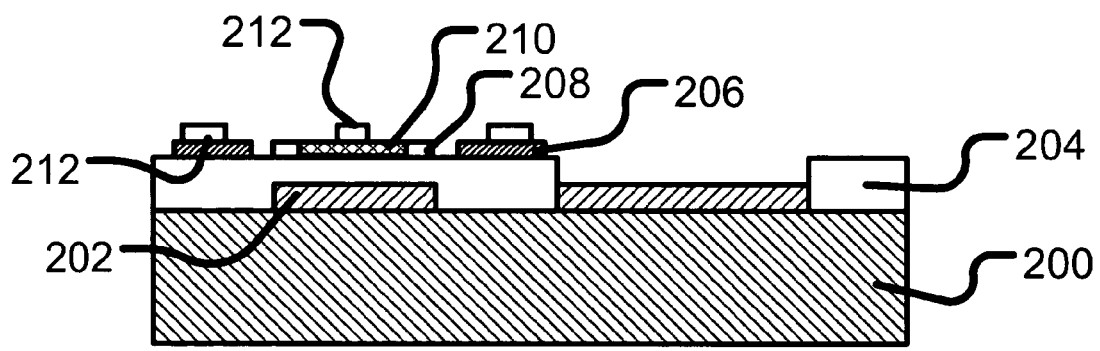

After the active region pattern has been formed, as illustrated in FIG. 2E, source/drain electrode banks 212a and a channel bank 212b are formed on the resulting structure. The channel bank 212b is configured for separating corresponding source/drain electrodes above the active region pattern 210 while the source/drain banks 212a are configured for confining the source/drain electrodes between corresponding pairs of data lines 206.

Figure 2F:
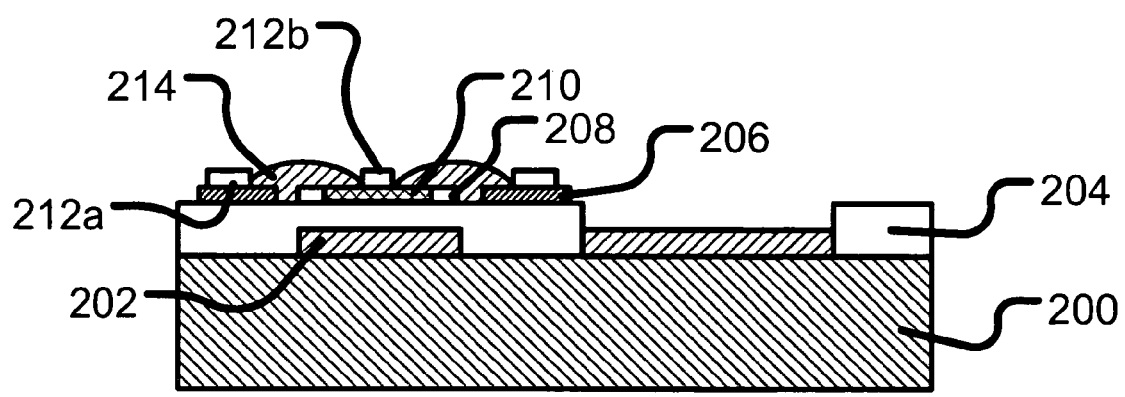
Figure 2G:
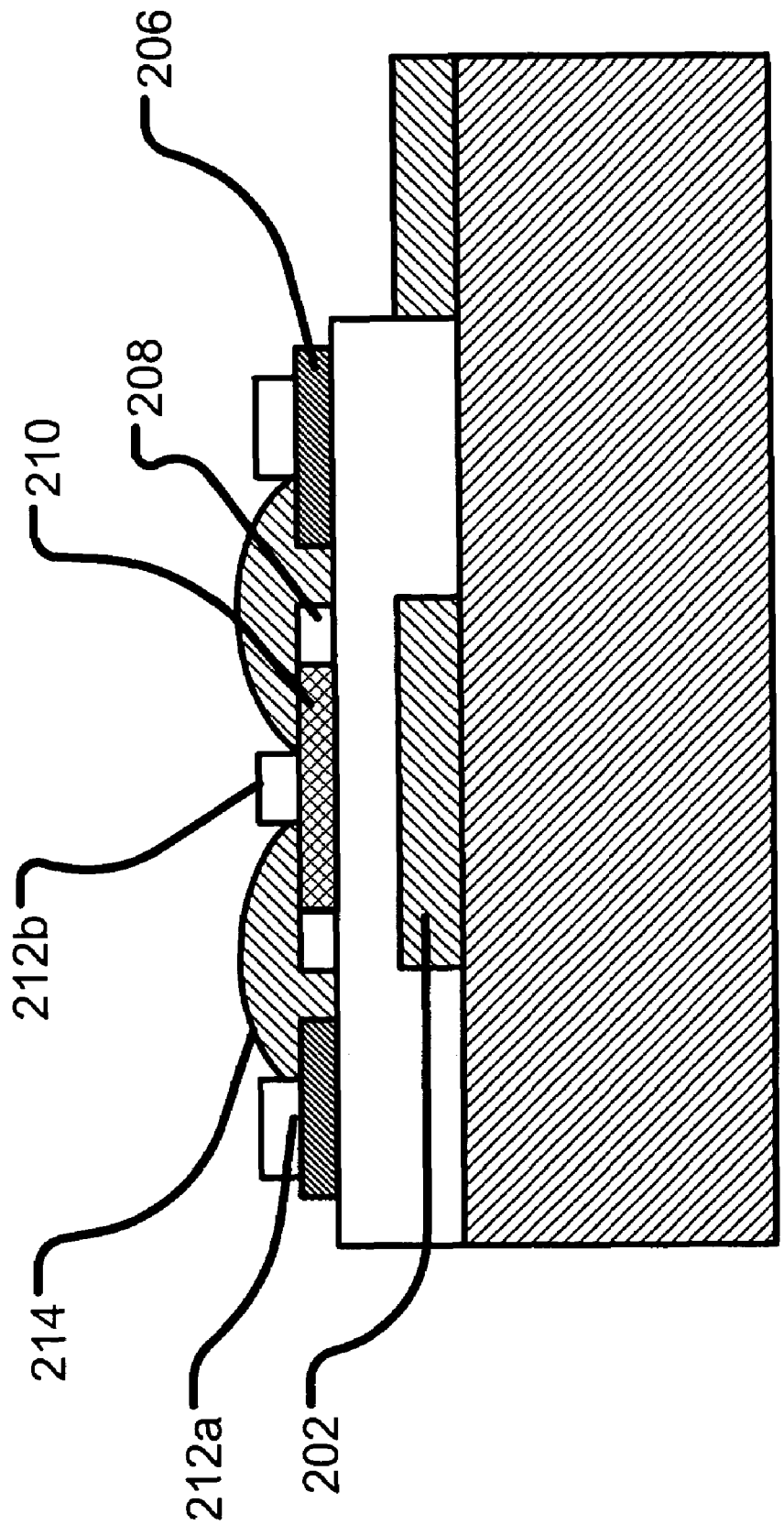
Figure 3A:
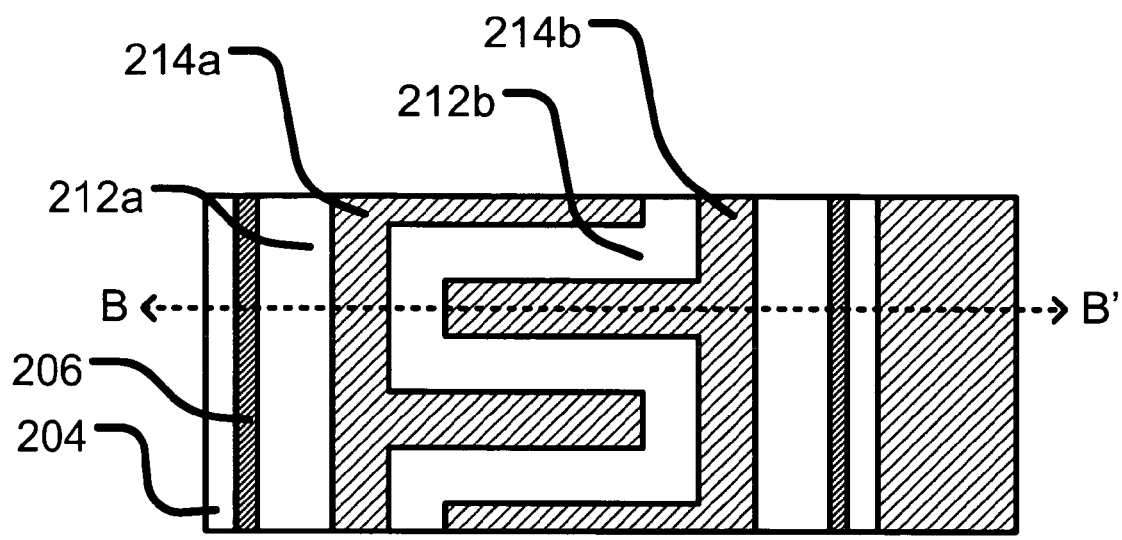
FIG. 3A is a plan view of an example embodiment of an electrode configuration that may be formed using a method according to an example embodiment and FIG. 3B is a cross-sectional representation of the structure in FIG. 3A taken along line B-B'.
Figure 3B:
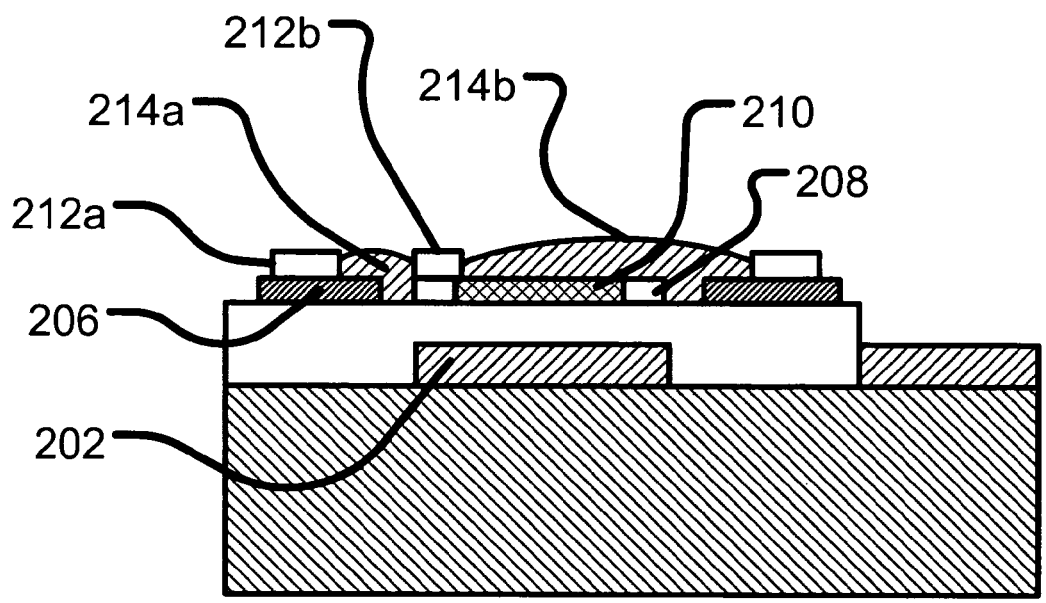

The source/drain electrode banks 212a and channel bank 212b can be fabricated using a method according to the example embodiment detailed above for forming the active region banks. As illustrated in FIGS. 2F and 2G, the source/drain electrodes 214 may then be formed by applying (e.g., by ink-jet printing) a conductive material that may be different from that utilized for the data lines on the regions of the data lines and the gate insulator pattern defined by the source/drain banks and the channel bank. As illustrated in FIGS. 3A and 3B, time, the source/drain electrodes 214a, 214b are separated from each other by the channel bank 212b and have their outer periphery defined by the source/drain banks 212a formed on the data lines 206.

Examples of suitable materials for the source/drain electrodes include, for example, organic conductive materials that may be incorporated in ink compositions, such as polythiophene, polyaniline, polyacetylene, polypyrrole, polyphenylene vinylene and polyethylenedioxythiophene/polystyrenesulfonate (PEDOT/PSS) mixtures and inorganic conductive materials including, for example, metals and metal compounds, such as gold (Au), silver (Ag), aluminum (Al), nickel (Ni), molybdenum (Mo), tungsten (W), indium tin oxide (ITO) and indium zinc oxide (IZO).

FIG. 3A is a plan view of a portion of source/drain electrodes formed by a method according to an example embodiment. As illustrated in FIG. 3A and the corresponding cross-sectional view provided in FIG. 3B, the source/drain electrodes 214a, 214b are separated by a channel defined by the channel block 212b and are for example, electroluminescence devices, liquid crystal devices, and electrophoresis devices.

Example embodiments also encompass electronic displays and devices incorporating one or more display devices that, in turn, incorporate one or more organic thin film transistors fabricated according to an example embodiment of the methods described above. Example embodiments of such electronic display devices include, for example, video displays, smart cards, and inventory tags.

Hereinafter, example embodiments will be explained in greater detail with reference to the following examples. However, these examples are given for the purpose of illustration and are not intended to limit example embodiments.

EXAMPLE

An organic insulator composition was prepared by blending a polyvinylphenol-based copolymer with an acrylic crosslinking agent. This organic insulator composition was then applied using a spin-coating method to a glass substrate on which an aluminum (Al) gate electrode had been previously formed. The properties of the organic insulator composition and the parameters of the spin-coating method combined to provide an insulating layer having a thickness of about 7,000 Å. This insulating film was then baked under a nitrogen atmosphere at 100° C. for one hour to form a gate insulator film having a final total thickness of about 6,000 Å.

An aluminum (Al) layer was deposited on the gate insulator film using a thermal evaporation technique, patterned and then etched to form pairs of data lines. connected to corresponding pairs of data lines 206. Further, the conductive material(s) using in forming the source/drain electrodes may be partially or completely distinct from the conductive material(s) used in forming the data lines.

Example embodiments also include organic thin film transistors comprising electrodes formed by example embodiments of the methods and may be configured as bottom gate-type organic transistor structures as illustrated in FIGS. 2A-3B, but those skilled in the art will appreciate that the techniques and methods detailed above may be readily adapted for fabricating alternative organic transistor structures including, for example, top gate structures.

The bottom gate type organic thin film transistors comprise a substrate, a gate electrode pattern formed on a surface of the substrate, a gate insulator pattern formed on the gate electrode, source/drain electrodes formed on the gate insulator pattern, and an organic semiconductor region formed on the gate insulator pattern and between the source/drain electrodes to provide a channel region for the organic thin film transistor. Alternatively, top gate type organic thin film transistors comprise a substrate, source/drain electrodes formed on the substrate, an organic semiconductor region formed on the substrate and between the source/drain electrodes to act as a channel region, a gate insulator pattern formed on the organic semiconductor region, and a gate electrode formed on the gate insulator pattern and above the channel region.

Other example embodiments include display devices incorporating one or more organic thin film transistors fabricated according to an example embodiment of the methods described above. Example embodiments of such display devices include, The corresponding pairs of data lines was configured to define the outer bounds of an elongated region in which source/drain regions will be formed.

Active region banks were then formed on the regions of the gate insulator pattern between the data lines and then an organic semiconductor, specifically a polythiophene derivative, was deposited between the active region banks on the gate insulator pattern by ink-jet printing in accordance with conventional procedures for thin film formation to provide an organic active region having a film thickness of about 500 Å.

Source/drain and channel banks were then formed using the method employed for the formation of the active region banks, and polyethylenedioxythiophene/polystyrenesulfonate (PEDOT/PSS) was deposited by ink-jet printing to form source/drain electrodes, completing fabrication of an organic thin film transistor.

Test Example 1

The charge carrier mobility and on/off current ratio ($I_{on}/I_{off}$ ratio) of the organic thin film transistor fabricated in Example 1 were calculated by the following respective equations, and the results are shown below in TABLE 1.

TABLE 1

| Example No. | Charge carrier mobility (cm$^2$/Vs) | $I_{on}/I_{off}$(cm$^2$/Vs) |
| --- | --- | --- |
| 1 | 0.30 | 8.78 × 10$^4$ |

Charge Carrier Mobility

The charge carrier mobility was calculated from the slope of a graph representing the relationship between $(I_{SD})^{1/2}$ and $V_G$ from the following current equations in the saturation region:

$$I_{SD} = \frac{WC_0}{2L}\mu(V_G - V_T)^2$$

$$\sqrt{I_{SD}} = \sqrt{\frac{\mu C_0 W}{2L}}(V_G - V_T)$$

$$\text{slope} = \sqrt{\frac{\mu C_0 W}{2L}}$$

$$\mu_{FET} = (\text{slope})^2 \frac{2L}{C_0 W}$$

Wherein $I_{SD}$ is the source-drain current, $\mu$ and $\mu_{FET}$ represent the charge carrier mobility, $C_o$ represents the capacitance of the oxide film, W represents the channel width, L represents the channel length, $V_G$ represents the gate voltage, and $V_T$ represents the threshold voltage.

$I_{on}/I_{off}$ Ratio

The $I_{on}/I_{off}$ ratio was determined from a ratio of a maximum current in the on-state to a minimum current in the off-state. The $I_{on}/I_{off}$ ratio is represented by the following equation:

$$\frac{I_{on}}{I_{off}} = \left(\frac{\mu}{\sigma}\right)\frac{C_o^2}{qN_A t^2}V_D^2$$

wherein $I_{on}$ represents the maximum current, $I_{off}$ represents the off-state leakage current, $\mu$ represents the charge carrier mobility, $\sigma$ represents the conductivity of thin film, q represents the electric charge, $N_A$ represents the electric charge density, t represents the thickness of semiconductor film, $C_0$ represents the capacitance of insulating film, and $V_D$ represents the drain voltage.

As can be seen from this equation, larger dielectric constants and smaller dielectric film thickness will tend to increase the $I_{on}/I_{off}$ ratio. Accordingly, the selection of the dielectric material(s) and thickness(es) of the dielectric film(s) will have a direct impact on the resulting $I_{on}/I_{off}$ ratio that will be exhibited by the devices. The off-state leakage current ($I_{off}$), the current flowing when the device is in the off-state, was defined as the minimum current measured with the device in the off-state.

Figure 4:
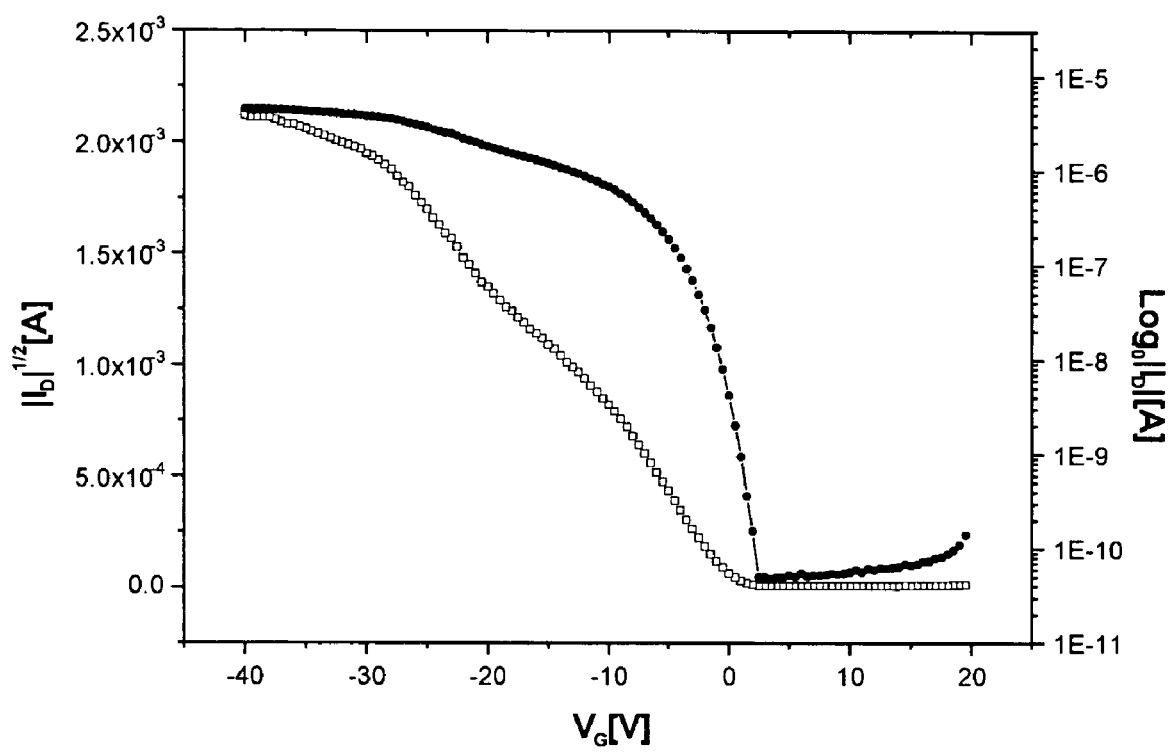
FIG. 4 is a graph illustrating current transfer characteristics of example embodiments of organic thin film transistors fabricated as described below in Example 1.

The current transfer characteristics of organic thin film transistors fabricated as described above in Example 1 were evaluated with the results shown in the graph illustrated in FIG. 4. FIG. 4 is a plot of $I_{SD}$ versus $V_G$ with increasingly effective dielectric constant.

As will be appreciated by those skilled in the art from the description, example and data presented herein, example embodiments include methods of fabricating organic thin film transistors that may provide improved patterning and accuracy in the formation of electrodes for organic electronic devices. Example embodiments also provide for the use of a wider range of conductive materials for forming source/drain electrodes including, for example, both metals and metal compounds including, for example, gold (Au) and indium tin oxide (ITO), as well as organic conductors including, for example, polyethylenedioxythiophene/polystyrenesulfonate (PEDOT/PSS) mixtures.

Although certain example embodiments have been disclosed for illustrative purposes, those skilled in the art will appreciate that various conventional modifications, additions and substitutions to the particular materials and techniques are possible, without departing from the scope and spirit of the disclosure.

What is claimed is:

1. A method for forming an organic electronic device, the method comprising, in order:
    forming a gate electrode pattern on a substrate;
    forming a gate insulator pattern on the gate electrode pattern and the substrate;
    forming data lines from a first conductive material on the gate insulator pattern;
    forming an active region pattern on a portion of the gate insulator pattern exposed between a pair of data lines; and
    forming source/drain electrodes from a second conductive material on the data lines, the gate insulator pattern and portions of the active region pattern, wherein the source/drain electrodes are separated from each other by a channel bank and wherein the first conductive material and the second conductive material are different.

2. The method according to claim 1, wherein:
    the first conductive material used in forming data lines is selected from a group consisting of metals, metal oxides and alloys and combinations thereof.

3. The method according to claim 2, wherein:
    the first conductive material includes a metal selected from a group consisting of gold (Au), silver (Ag), aluminum (Al), nickel (Ni), molybdenum (Mo), tungsten (W) and alloys and combinations thereof.

4. The method according to claim 2, wherein:
    the first conductive material includes a metal oxide selected from a group consisting of indium tin oxide (ITO), indium zinc oxide (IZO) and combinations thereof.

5. The method according to claim 1, wherein forming the active region pattern further comprises:
    forming active region banks between the data lines; and
    depositing a semiconducting material between the active region banks.

6. The method according to claim 5, wherein:
    the semiconducting material includes a compound selected from a group consisting of pentacene, tetracene, copper phthalocyanine, polythiophene, polyaniline, polyacetylene, polypyrrole, polyphenylene vinylene, and mixtures, combinations and derivatives thereof.

7. The method according to claim 1, wherein forming the source/drain electrodes further comprises:
    forming source/drain electrode banks and an intermediate channel bank between the source/drain electrode banks; and
    depositing the second conductive material in two source/drain regions defined between the source/drain electrode banks and the channel bank.

8. The method according to claim 1, wherein:
    the channel bank is arranged above the active region pattern whereby the source/drain electrodes include an inner edge of alternating projections and recesses.

9. The method according to claim 1, wherein:
    the source/drain electrodes exhibit a crenulated inner edge.

10. The method according to claim 1, wherein:
    the gate insulator pattern is formed from a material selected from a group consisting of polyvinylphenols, polymethyl methacrylates, polyacrylates, polyvinyl alcohols, $SiN_x$ (0<x<4), $SiO_2$, $Al_2O_3$ and combinations thereof.

11. The method according to claim 1, wherein:
    the gate electrode is made from a material selected from a group consisting of gold (Au), silver (Ag), aluminum (Al), nickel (Ni), molybdenum (Mo), tungsten (W), indium-tin oxide (ITO), polythiophene, polyaniline, polyacetylene, polypyrrole, polyphenylene vinylene, polyethylenedioxythiophene (PEDOT)/polystyrenesulfonate (PSS) mixtures and alloys, mixtures and combinations thereof.

12. The method according to claim 1, wherein:
the second conductive material used in forming the source/drain electrodes is selected from a group consisting of gold (Au), silver (Ag), aluminum (Al), nickel (Ni), molybdenum (Mo), tungsten (W), indium tin oxide (ITO), indium zinc oxide (IZO), polythiophenes, polyanilines, polyacetylenes, polypyrroles, polyphenylene vinylenes, polyethylenedioxythiophene/polystyrenesulfonate (PEDOT/PSS) mixtures and alloys, combinations and mixtures thereof.

13. The method according to claim 1, wherein:
the substrate is made from a material selected from a group consisting of inorganic insulating materials, semiconducting materials, organic insulating materials and combinations thereof.

14. An organic thin film transistor comprising:
a substrate;
a gate electrode pattern formed on the substrate;
a gate insulator pattern formed on the gate electrode pattern and the substrate;
a pair of data lines of a first conductive material formed on the gate insulator pattern;
an active region pattern formed on a portion of the gate insulator pattern exposed between the pair of data lines; and
source/drain electrodes of a second conductive material formed on portions of the data lines, the gate insulator pattern and the active region pattern, wherein the source/drain electrodes are separated from each other by a channel bank and wherein the first conductive material and the second conductive material are different.

15. The organic thin film transistor according to claim 14, wherein:
the active region pattern is formed in a region of the gate insulator pattern exposed between a pair of active region banks.

16. The organic thin film transistor according to claim 14, wherein:
the source/drain electrodes are formed on regions of the data lines, the gate insulator pattern and portions of the active region pattern exposed between peripheral source/drain electrode banks and an intermediate channel bank arranged between the source/drain electrode banks.

17. The organic thin film transistor according to claim 16, wherein:
the channel bank is configured whereby alternating portions of the active region pattern are arranged below a source electrode and a drain electrode comprising a source/drain electrode pair.

18. The organic thin film transistor according to claim 17, wherein:
the source electrode and the drain electrode exhibit complementary crenulated edges separated by the channel bank.

19. The organic thin film transistor according to claim 14, wherein:
the first conductive material is selected from a group consisting of gold (Au), silver (Ag), aluminum (Al), nickel (Ni), molybdenum (Mo), tungsten (W), indium tin oxide (ITO), indium zinc oxide (IZO) and alloys and combinations thereof, and
the second conductive material is selected from a group consisting of gold (Au), silver (Ag), aluminum (Al), nickel (Ni), molybdenum (Mo), tungsten (W), indium tin oxide (ITO), indium zinc oxide (IZO), polythiophenes, polyanilines, polyacetylenes, polypyrroles, polyphenylene vinylenes, polyethylenedioxythiophene/polystyrenesulfonate (PEDOT/PSS) mixtures and alloys, combinations and mixtures thereof.

20. A display device comprising:
an organic thin film transistor according to claim 14.

* * * * *